United States Patent [19]
Chao et al.

[11] Patent Number: 5,780,315
[45] Date of Patent: Jul. 14, 1998

[54] DRY ETCH ENDPOINT METHOD

[75] Inventors: Ying-Chen Chao; Ting-Hwang Lin, both of Hsin-Chu, Taiwan

[73] Assignee: Taiwan Semiconductor Manufacturing Company, Ltd., Hsin-Chu, Taiwan

[21] Appl. No.: 816,478

[22] Filed: Mar. 13, 1997

Related U.S. Application Data

[63] Continuation of Ser. No. 526,086, Sep. 11, 1995, abandoned.

[51] Int. Cl.$^6$ ............................................. H01L 21/302
[52] U.S. Cl. ........................ 438/8; 438/9; 438/720; 438/963
[58] Field of Search ................... 438/8, 9, 16, 720, 438/734, 963; 216/59, 60

[56] References Cited

U.S. PATENT DOCUMENTS

| | | | |
|---|---|---|---|
| 4,493,745 | 1/1985 | Chen et al. | 156/626.1 |
| 4,668,335 | 5/1987 | Mockler et al. | 438/720 |
| 4,713,141 | 12/1987 | Tsang | 156/626.1 |
| 4,980,018 | 12/1990 | Mu et al. | 156/626.1 |
| 5,016,663 | 5/1991 | Mase et al. | 216/59 |
| 5,017,513 | 5/1991 | Takeuchi | 438/720 |
| 5,035,768 | 7/1991 | Mu et al. | 156/626 |
| 5,190,614 | 3/1993 | Leach et al. | 216/59 |
| 5,230,772 | 7/1993 | Kadomura | 156/643 |
| 5,232,537 | 8/1993 | Yachi | 156/626.1 |
| 5,242,536 | 9/1993 | Schoenborn | 156/643.1 |
| 5,308,447 | 5/1994 | Lewis et al. | 156/626 |
| 5,467,883 | 11/1995 | Frye et al. | 156/626.1 |
| 5,474,650 | 12/1995 | Kumihashi et al. | 156/626.1 |
| 5,501,766 | 3/1996 | Barbee et al. | 156/627.1 |
| 5,522,520 | 6/1996 | Kawamoto | 156/656.1 |

FOREIGN PATENT DOCUMENTS

| | | |
|---|---|---|
| 62-7880 | 1/1987 | Japan . |
| 2-71519 | 3/1990 | Japan . |

*Primary Examiner*—R. Bruce Breneman
*Assistant Examiner*—Anita Alanko
*Attorney, Agent, or Firm*—George O. Saile; Stephen B. Ackerman

[57] ABSTRACT

An improved method for selecting etch endpoint when dry etching conductive material layers for use in semiconductor device circuits has been created. The more precise endpoint selection procedure produces metallization patterns which are free from residues (resulting from under-etching) and free from sidewall attack and/or pattern degradation (resulting from over-etching). The method avoids costly and time consuming pre-sorting of substrates according to product pattern density.

3 Claims, 3 Drawing Sheets

5,780,315

1

DRY ETCH ENDPOINT METHOD

This application is a continuation of U.S. application Ser. No. 08/526,086, filed Sep. 11, 1995, now abandoned.

BACKGROUND OF THE INVENTION (1) Field of the Invention

This invention relates to the fabrication of semiconductor components, and more particularly to the formation of conducting patterns by dry etching methods. More specifically, the invention is directed to the method of endpoint selection during dry etching of metal conductor patterns on insulating substrates.

(2) Description of Related Art

In the fabrication of semiconductor components, metal conductor lines are used to interconnect the many components in device circuits. Due to shrinkage in size of semiconductor components and increased circuit density, the complexity of interconnecting the many components in the dense circuits requires that the fabrication processes used to define the metal interconnect patterns provide precise dimensional control. Unwanted loss of conductor line width reduces the cross-sectional area of the conductor line, which causes an increase in current density in the conductor during use. Excess current density is a significant factor leading to circuit failure. Furthermore, the metal pattern fabrication processes must, also, provide a residue-free area between conducting line patterns. Incomplete etching, resulting in residue, causes unwanted shorting between conducting lines, thereby reducing the manufacturing process yield.

In general, dry etching processes such as RIE (Reactive Ion Etching) and other plasma etching processes are used in current manufacturing processes for semiconductor devices. In particular, the process steps used to pattern metal conductor patterns comprise: deposition of a metal layer; formation, by standard photolithographic techniques, of a photoresist mask or other mask, such as magnesium oxide or silicon oxide, in the form of the desired metal interconnection pattern; dry etching to remove the metal layer from the areas not covered by the mask, leaving the metal layer in the form of the masked pattern; removing the mask layer, exposing the top surface of the metal layer.

As part of the dry etching process to remove the metal layer from the areas not covered by the mask, it must be accurately determined when just enough of the metal layer has been removed; i.e., to detect an endpoint of the removal operation. The endpoint determination is then used to monitor the progress of the process and/or to control the process, such as by automatically terminating the processing operation being monitored. In the case of a dry etching process, wherein material is removed by bombardment in a plasma chamber, a species within the plasma is monitored by detecting the emission of light in a limited wavelength band that shows material is being removed from the layer being etched. The detected signal drops off at breakthrough and this change that occurs at breakthrough is detectable and useful as an endpoint indicator. However, although the nominal endpoint for the etch process is detectable, there exists the necessity for overetching to compensate for the non-uniformities of the various fabrication steps, including the thickness non-uniformity of the conductive material deposition process and the non-uniformity of the etching of the conductive material during the main etch step. The non-uniformity and variability of etchrate is due to several factors, as described below.

One deficiency of dry etching processes is a "micro-loading effect", which means a phenomenon in which, when a material layer to be etched is masked to a particular pattern form, the local etching rate is changed as a function of the size of the etched area. For example, if the local etched area is small, then the etch rate is decreased and endpoint is achieved in a longer time. Conversely, if the local etched area is large, then the etch rate is increased and endpoint is achieved in a shorter time. U.S. Pat. No. 5,230,772 entitled "Dry Etching Method" granted Jul. 27, 1993 to Shingo Kadomura teaches a method for suppressing this "micro-loading effect" when etching resist material by controlling the temperature of the substrate.

U.S. Pat. No. 5,035,768 entitled "Novel Etch Back Process For Tungsten Contact/Via Filling" granted to Xiao-Chun Mu et al relates to a blanket tungsten layer etchback process in which the "micro-loading effect" causes an acceleration of tungsten etch rate in contact openings when the bulk of the tungsten layer has been removed from the surface of the substrate. The result is that the tungsten contact plugs are recessed below the surface of the dielectric substrate and sometimes completely removed by the end of the blanket etch. This invention describes a three step etch process in which gas chemistry and process parameters are changed in order to minimize this "micro-loading effect".

U.S. Pat. No. 5,308,447 entitled "Endpoint and Uniformity Determinations in Material Layer Processing Through Monitoring Multiple Surface Regions Across the Layer" granted to Russell E. Lewis et al describes endpoint monitoring of a layer removal process in each of at least two separate regions across the substrate surface so that different endpoint times, due to non-uniformities in either the layer thickness or the etchrate of the removal process, can be detected.

Another deficiency of dry etching processes is the effect of global or overall "pattern factor" or "pattern density" on the nominal etchrate. "Pattern factor" is defined as the ratio of total masked area to total area on a substrate and may have a value between 0 and 1. "Pattern density" is defined as the percentage ratio of total masked area to total area on a substrate, and may have a value from 0 to 100%. That is, a high "pattern factor" or high "pattern density" means that a large percentage of the area on a substrate is masked and only a small percentage of the area is subject to etching. Conversely, a low "pattern factor" or low "pattern density" means that a small percentage of the area on a substrate is masked and therefore a large percentage of the area is subject to etching. When substrates subjected to a dry etching process have a large pattern factor the etchrate is increased and endpoint is detected in a shorter time. And, when substrates subjected to a dry etching process have a small pattern factor the etchrate is decreased and endpoint is detected in a longer time.

In the practical application of dry etching processes to the fabrication of semiconductor devices, there exists, particularly for interconnection conductive pattern layers, significant variation in "pattern factor", because of the differences of required pattern density for different device products and at different interconnection levels. Conductive pattern densities ranging between about 10% to 70% are common in the industry. When the pattern density is low, endpoint during the main etch occurs at a relatively long time because of the necessity to etch away large areas of conductive material during the etch process. When the pattern density is high, endpoint during the main etch occurs at a relatively short time because only small areas of conductive material need to be etched.

Also, as a practical matter the detection of endpoint in the main etch process does not signal complete removal of unwanted conductive material over the entire substrate. Overetch is required to compensate for the non-uniformity of the conductive material deposition process and the non-uniformity of the main etch process. Prescription of the overetch time is critical due to several factors. Insufficient overetch results in residual unwanted conductive material being left on some areas of the substrate. And, excessive overetch results in sidewall attack of the masked conductive material. Furthermore, the optimum overetch time is dependent on the pattern density.

Usual semiconductor manufacturing practice for dry etching conductive material layers is to aggregate products with the same pattern density into a single group, which is then treated with a specified overetch process following the main etch of the conductive material. This practice leads to manufacturing line scheduling and tracking problems due to the wide variety of pattern densities which must be processed with individual main etch/overetch recipes. The necessity to schedule, track and group products for etching reduces the throughput of an etch process machine and adds additional cost to the product.

SUMMARY OF THE INVENTION

One object of the present invention is to provide an improved and new process for dry etching metal conductor patterns, which through a more precise endpoint selection procedure produces metallization patterns which are free from residues (resulting from under-etching) and free from sidewall attack and/or pattern degradation (resulting from over-etching).

Another object of the present invention is to provide a new and improved process of dry etching metal conductor patterns, which is not subject to costly and time consuming pre-sorting of substrates according to product pattern density.

The method in accordance with the invention comprises, loading a wafer cassette, containing substrates having a mask pattern formed over a conductive material layer, to a plasma etcher apparatus. During etching of the conductive material layer endpoint is detected and the elapsed time of the main etch process, from beginning to endpoint, is stored in a computer. Immediately, and on-line, the required overetch time is selected, based on the stored time of the main etch process and stored charted experience of overetch versus main etch endpoint time in order to achieve optimum etch results. Etching then proceeds for the computer selected overetch time.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming semiconductor devices, using dry etching of conductor patterns and the new and improved method of endpoint selection will now be described in detail. The method can be used for etching patterns in doped polysilicon, aluminum, aluminum-copper, aluminum-copper-silicon, tungsten, and other conductive layers used in the manufacture of semiconductor circuit devices. Only the specific areas unique to understanding this invention will be described in detail.

Figure 1:
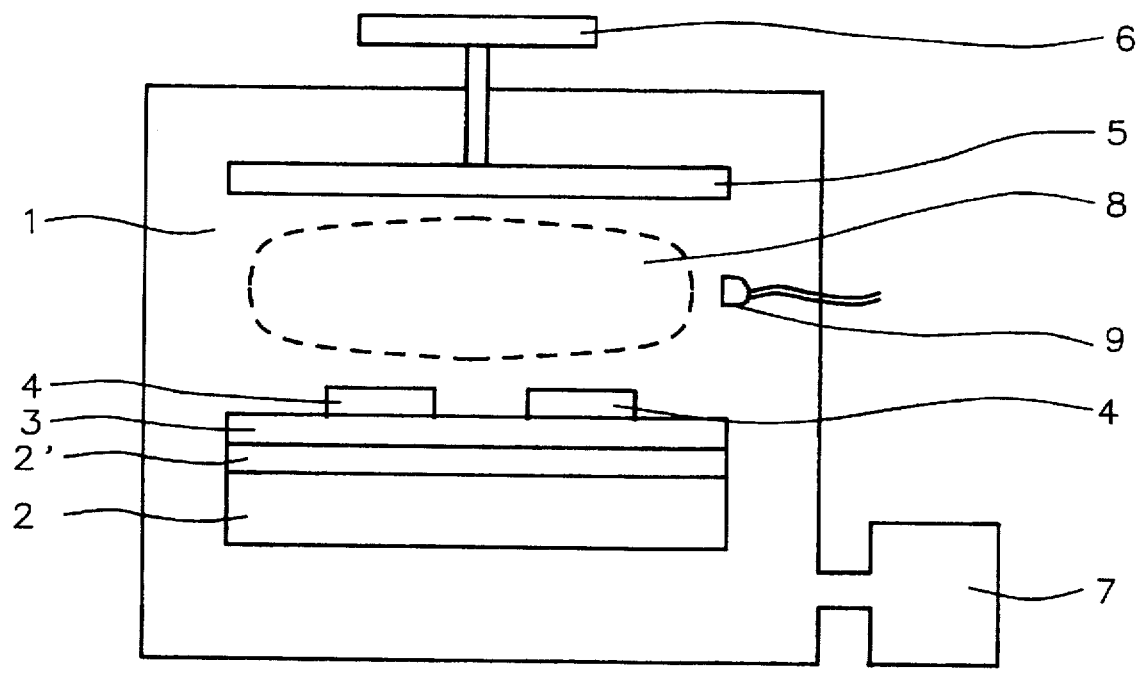
FIG. 1, which schematically, in cross-sectional representation, illustrates a plasma etcher, in which substrates having a mask pattern formed over a conductive material layer are etched to remove the unwanted conductive material layer.

FIG. 1 shows a typical plasma etcher, in which substrates having a mask pattern formed over a conductive material layer are etched to remove the unwanted conductive material layer. The method of the invention will be described for etching patterns in a conductive layer of aluminum-copper-silicon deposited over a conductive barrier underlayer of titanium-titanium nitride. Within a vacuum chamber, 1, is a substrate, 2, onto which is deposited a layer of conductive material, 3, to be etched and a masking pattern, 4. The substrate, 2, is conventionally a monocrystalline semiconductor substrate provided with an overlying dielectric layer, 2'. In fabricating integrated circuit semiconductor devices, the substrate will conventionally have fabricated therein various active and passive devices which are not illustrated in FIG. 1 since they do not constitute part of the invention. Also, not shown are the via openings in dielectric layer, 2'. These via openings provide contacts to the aforementioned devices in the substrate. The devices may include metal oxide semiconductor field effect transistor, (MOSFET), devices of either NFET or PPET types and/or complimentary, CMOS, as well as BiCMOS devices. Within the vacuum chamber, 1, is a target structure, 5, which is connected to a power supply, 6, which provides dc, ac, rf, or microwave power, depending on the specific process being implemented. A gas supply, 7, provides inert and reactive gases as required for the specific process. As is well known, energizing the power supply causes a plasma, 8, to be formed over the substrate, 2. Reactive species within the plasma, 8, cause etching of the unmasked conductive layer, 3. A light detection device, 9, measures light emission from energetic species in the plasma, 8, over a limited wavelength band. The wavelength band is chosen so as to detect a species that shows that etching of the conductive layer is taking place. Typically the monitored light emission from such a species will increase when etching is initiated, stay at a relatively constant level during etching, and then decrease during breakthrough exposing the underlying dielectric.

Figure 2A:
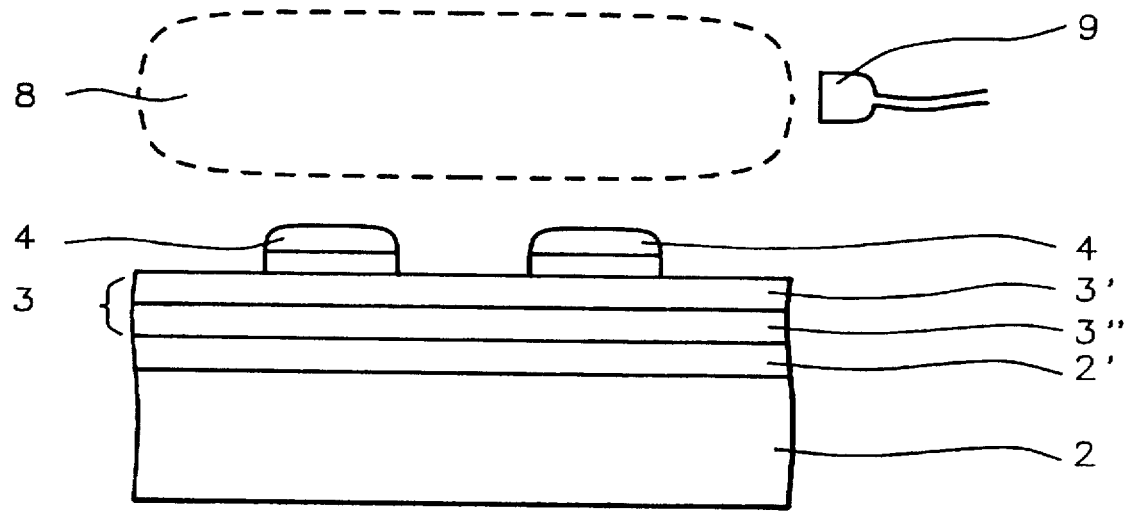
FIGS. 2A and 2B, which illustrate use of the present invention in controlling the overetch step in the sequence of steps used to etch a conductive layer to completion.
Figure 2B:
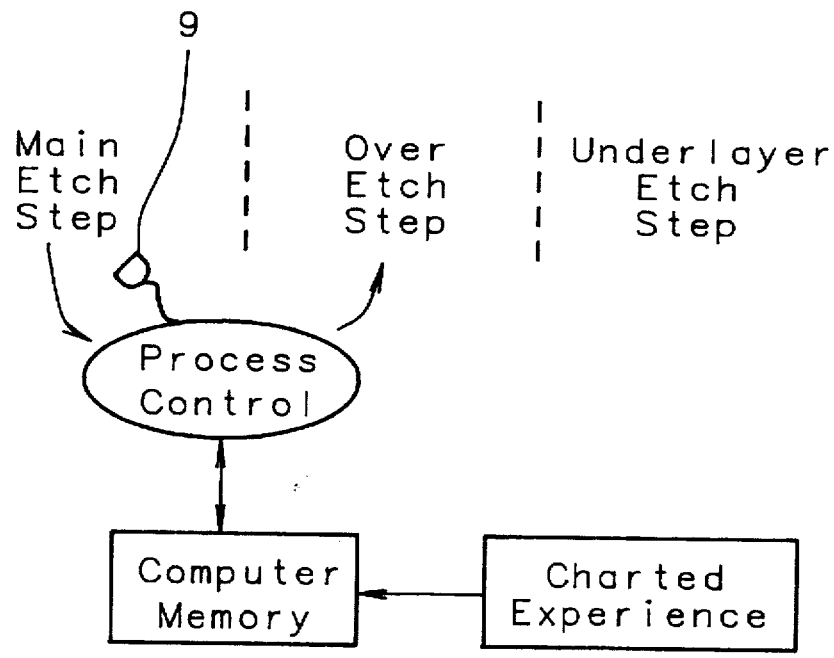

FIG. 2B shows the sequence of process steps used to etch a pattern, shown in FIG. 2A, in a conductive layer, 3, comprising a layer of aluminum-copper-silicon, 3', deposited over a conductive barrier underlayer of titanium-titanium nitride, 3", to completion and the use of the present invention in controlling the overetch step in this sequence of steps. The aluminum-copper-silicon, 3', has a thickness between about 3000 to 10000 Angstroms; the percentage copper is between about 0 to 3%, added to aluminum to increase its electromigration resistance; the percentage silicon is between about 0 to 2%, added to aluminum to prevent silicon depletion of shallow junctions. The conductive barrier underlayer, 3", comprises titanium deposited to a thickness between about 100 to 400 Angstroms and titanium nitride deposited to a thickness between about 600 to 1000 Angstroms. The masking pattern, 4, is formed in photoresist, magnesium oxide, or silicon oxide by conventional photolithographic and mask fabrication processes used in semiconductor device manufacturing. The main etch step is performed using $Cl_2$ and $BCl_3$ at an ambient pressure between about 100 to 250 mTorr. Etching during the main etch step is monitored by measuring light emission from the plasma, 8, in a limited wavelength band between about 360 to 400 nm, using light detection device, 9, and endpoint is detected when the measured light intensity falls to a prescribed level in relationship to the maximum intensity observed during the main etch step. Timing of the main etch process takes place from the beginning of the etch to the detected endpoint and this time is stored in a computer memory. Also, stored in the computer memory is a table of at least two choices of overetch times based on the time to achieve endpoint in the main etch step. This table of overetch time versus main etch endpoint time is based upon charted experience for etching a particular thickness of conductive layer with a broad range of mask pattern densities, thus resulting in a broad range of detected endpoint times during the main etch step.

Figure 3:
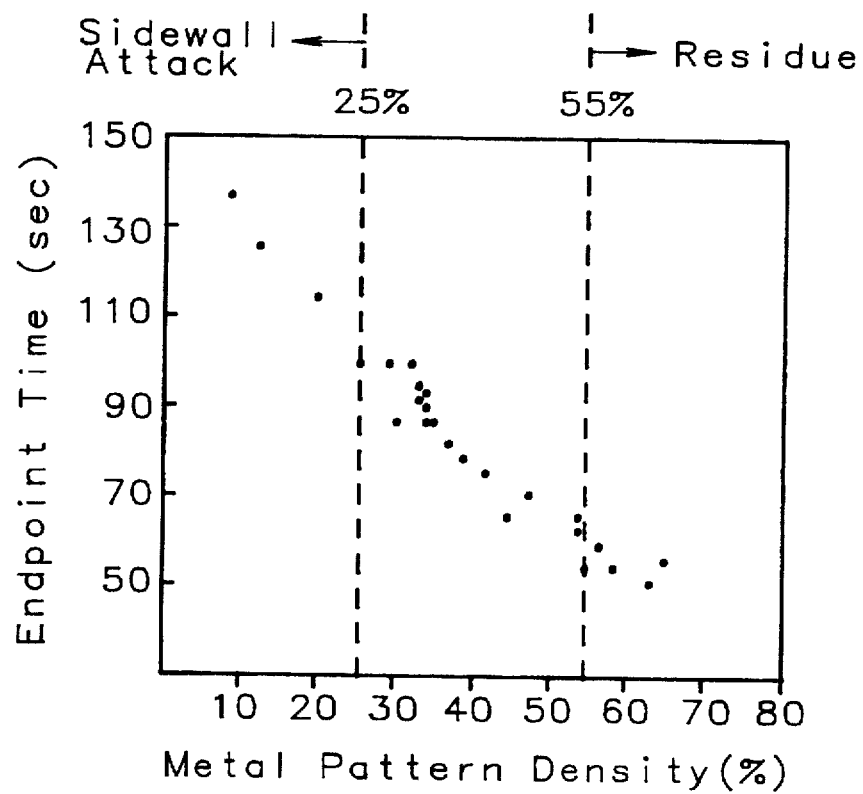
FIG. 3, which is a graph of charted experience showing the dependency of endpoint time and susceptibility of metal residue and sidewall attack on the pattern density when etching aluminum-copper-silicon.

FIG. 3 contains charted experience for etching a 6000 Angstroms thick conductive layer of aluminum-copper-silicon, where the pattern density of the mask ranges from between about 10 to 70%. In FIG. 3 the ordinate stands for the endpoint time (sec) during the main etch and the abscissa stands for the pattern density (%). When the pattern density is less than about 25%, endpoint is achieved at times greater than about 100 sec and too much overetching results in metal pattern sidewall attack and unwanted loss of metal. When the pattern density is greater than about 55%, endpoint is achieved at times less than about 60 sec, but unwanted metal residues remain following endpoint detection during the main etch, and longer overetching times are required in order to remove these residues. Such charted experience permits one to make a decision on selecting the overetch time based on the result of the time to endpoint detected in the main etch step. The combination of main etch and selected overetch produces optimum etching results without the necessity to predetermine the pattern density of product substrates before loading into the plasma etcher.

Figure 4:
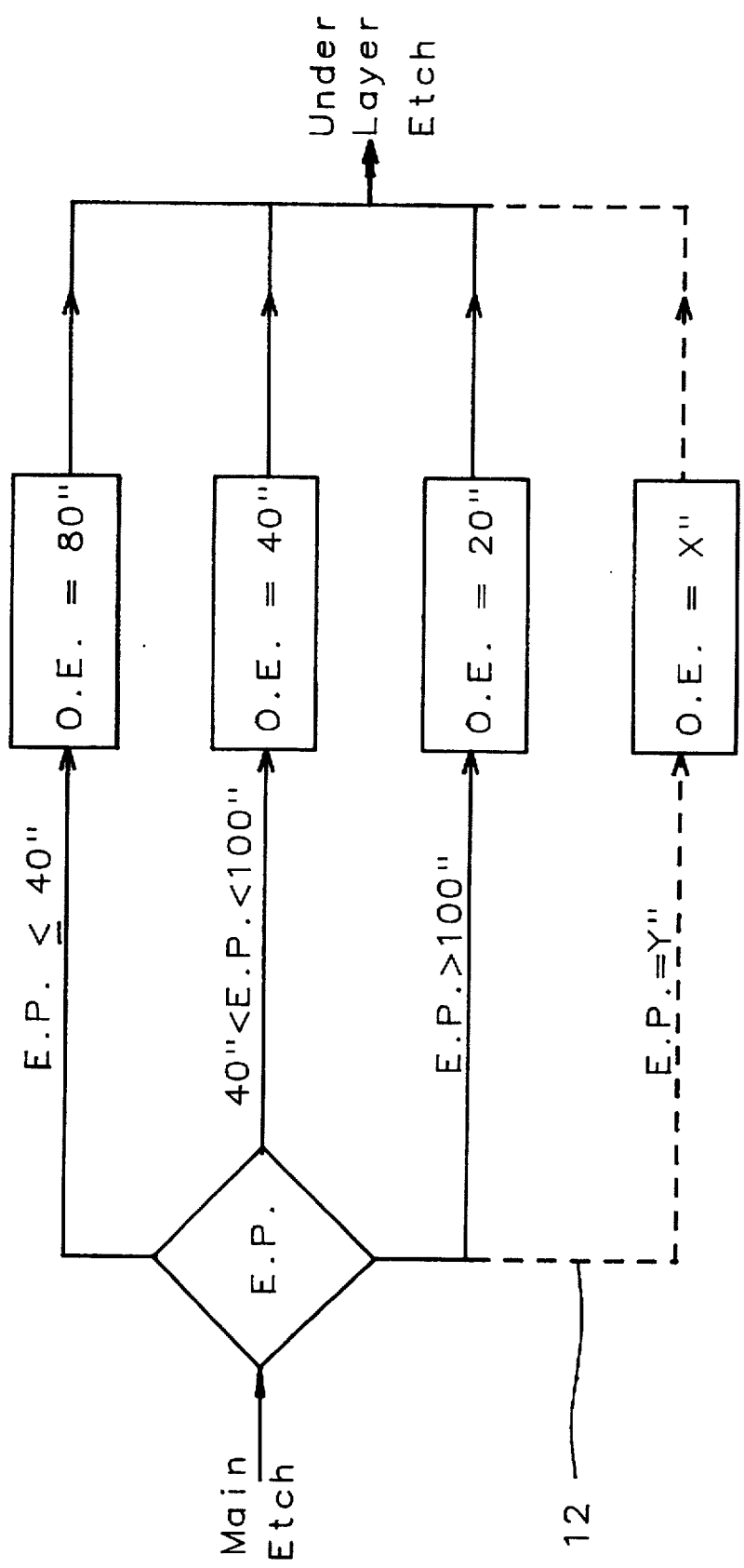
FIG. 4, which illustrates a decision tree used to select the required overetch time, based on the time to detect endpoint in the main etch step.

FIG. 4, shows a decision tree used to select the required overetch (O.E.) time, based on the time to detect endpoint (E.P.) in the main etch step. The selected overetch time is derived from the charted experience for the particular thickness conductive layer, as illustrated in FIG. 3 for a 6000 Angstroms thick conductive layer of aluminum-copper-silicon. The decision tree has at least two choices of overetch times, based on the detected endpoint time during the main etch step. As illustrated, the decision tree has the capability to select three different overetch times based on the detected endpoint time in the main etch step, but additional decision paths may also be stored in the computer memory in order to facilitate the needs of the process, as indicated by dashed line, 12, having as example, E.P.=Y"(seconds) and O.E.=X" (seconds).

Referring again to FIGS. 2A and 2B, upon completion of the main etch and overetch steps for etching the aluminum-copper-silicon layer, 3', the conductive barrier underlayer of titanium-titanium nitride, 3", is etched using $Cl_2$ at an ambient pressure between about 30 to 50 mTorr.

A second embodiment of the invention provides a conductive layer comprising doped polysilicon which is etched using HBr and $Cl_2$ at an ambient pressure between about 200 to 450 mTorr and endpoint detection for etching the doped polysilicon is performed by measuring the emission of light in a wavelength band between about 400 to 420 nm.

A third embodiment of the invention provides a conductive layer comprising tungsten which is etched using $SF_6$ at a ambient pressure between about 200 to 400 mTorr and endpoint detection for etching the tungsten is performed by measuring the emission of light in a wavelength between about 690 to 710 nm.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of an interconnection layer in an integrated circuit comprising:

loading wafer cassette, containing substrates having a mask pattern formed over an aluminum-copper-silicon layer, to a plasma etcher apparatus;

etching of said aluminum-copper-silicon layer by vertical etching, using $BCl_3$ and $Cl_2$ at an ambient pressure between about 100 to 250 mTorr whereby said etching apparatus also produces residues;

detecting the endpoint of said vertical etching;

timing said vertical etching process from the beginning to said detected endpoint;

storing said detected endpoint in a computer wherein is also stored charted experience of desired overetch time versus detected endpoint;

comparing said detected endpoint to said stored charted experience comprising a table of, at least two overetch times versus detected endpoints, where said table resides in the computer memory;

selecting an overetch time, based upon said detected endpoint and said charted experience to reduce said residues;

etching of said aluminum-copper-silicon layer for said selected overetch time, by vertical etching, using $BCl_3$ and $Cl_2$ at an ambient pressure between about 100 to 250 mTorr; and etching a conductive barrier underlayer of titanium-titanium nitride using $Cl_2$ at an ambient pressure between about 30 to 50 mTorr.

2. A method of fabrication of an interconnection layer in an integrated circuit comprising:

loading wafer cassette, containing substrates having a mask pattern formed over a doped polysilicon layer, to a plasma etcher apparatus;

etching of said doped polysilicon layer by vertical etching, using HBr and $Cl_2$ at an ambient pressure between about 200 and 450 mTorr whereby said etching also produces residues;

detecting the endpoint of said vertical etching;

timing said vertical etching process from the beginning to said detected endpoint;

storing said detected endpoint in a computer wherein is also stored charted experience of desired overetch time versus detected endpoint;

comparing said detected endpoint to said stored charted experience comprising a table of, at least two overetch times versus detected endpoints, where said table resides in the computer memory;

selecting an overetch time, based upon said detected endpoint and said charted experience to reduce said residues;

etching of said doped polysilicon layer for said selected overetch time, by vertical etching, using HBr and $Cl_2$ at an ambient pressure between about 200 to 450 mTorr; and etching a conductive barrier underlayer of titanium-titanium nitride using $Cl_2$ at an ambient pressure between about 30 to 50 mTorr.

3. A method of fabrication of an interconnection layer in an integrated circuit comprising:

loading wafer cassette, containing substrates having a mask pattern formed over a tungsten layer, to a plasma etcher apparatus;

etching of said tungsten layer by vertical etching, using $SF_6$ at an ambient pressure between about 200 to 400 mTorr whereby said etching also produces residues;

detecting the endpoint of said vertical etching;

timing said vertical etching process from the beginning to said detected endpoint;

storing said detected endpoint in a computer wherein is also stored charted experience of desired overetch time versus detected endpoint;

comparing said detected endpoint to said stored charted experience comprising a table of, at least two overetch times versus detected endpoints, where said table resides in the computer memory;

selecting an overetch time, based upon said detected endpoint and said charted experience to reduce said residues;

etching of said tungsten layer for said selected overetch time, by vertical etching, using $SF_6$ at an ambient pressure between about 200 to 400 mTorr; and etching a conductive barrier underlayer of titanium-titanium nitride using $Cl_2$ at an ambient pressure between about 30 to 50 mTorr.

* * * * *